(12) United States Patent
Ramsbey et al.

(10) Patent No.: US 6,548,855 B1
(45) Date of Patent: Apr. 15, 2003

(54) NON-VOLATILE MEMORY DIELECTRIC AS CHARGE PUMP DIELECTRIC

(75) Inventors: Mark T. Ramsbey, Sunnyvale, CA (US); Arvind Halliyal, Cupertino, CA (US); Kuo-Tung Chang, Saratoga, CA (US); Nicholas H. Tripsas, San Jose, CA (US); Wei Zheng, Sunnyvale, CA (US); Unsoon Kim, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/147,622

(22) Filed: May 16, 2002

(51) Int. Cl.[7] ................................. H01L 29/76
(52) U.S. Cl. .................. 257/314; 257/298; 257/299; 438/257; 438/266
(58) Field of Search ................. 257/314, 315, 257/316, 317, 318, 319, 320, 321, 322, 298, 299, 300; 438/257, 258, 266

(56) References Cited

U.S. PATENT DOCUMENTS 5,420,449 A * 5/1995 Oji .............................. 257/304
6,222,245 B1   4/2001 Bez et al.
6,423,997 B1 * 7/2002 Takahashi ................... 257/298

* cited by examiner

*Primary Examiner*—Carl Whitehead, Jr.
*Assistant Examiner*—Jack Chen
(74) *Attorney, Agent, or Firm*—Renner, Otto, Boisselle & Sklar

(57) ABSTRACT

A non-volatile memory device for retention of data when electrical power is terminated. The non-volatile memory device includes at least one memory cell and a charge pump for stepping up the incoming voltage supply. The charge pump includes at least one capacitor, wherein the dielectric of the charge pump capacitor and the dielectric of the memory cell are formed during the same processing step.

6 Claims, 5 Drawing Sheets

NON-VOLATILE MEMORY DIELECTRIC AS CHARGE PUMP DIELECTRIC

FIELD OF THE INVENTION

The present invention relates to the field of non-volatile memory devices. More particularly, the invention relates to using a dielectric layer of a non-volatile memory device as the dielectric for a charge pump capacitor.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Typically, a non-volatile memory device includes a floating-gate electrode upon which an electrical charge is stored. The floating-gate electrode overlies a channel region residing between source and drain regions in a semiconductor substrate. The floating-gate electrode together with the source and drain regions form an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

The high positive voltage required to program, read or erase such memory devices is typically greater than the input supply voltage. To develop the required high voltage levels for programming and erasing, a charge pump is employed within the memory device to multiply or "step up" the incoming supply voltage. A charge pump is a device readily incorporated onto a memory device which can be used to generate and maintain an internal supply voltage from an external supply voltage. The charge pump typically increases a small input voltage into a larger voltage that is used within the memory device. The charge pump usually includes a number of connected pump stages that are driven by two non-overlapping clock signals, and each pump stage consists of at least one charge pump capacitor. During the first clock cycle, each pump stage is connected effectively in a parallel configuration and will be charged up to the input supply voltage. During the next clock cycle, the banks are switched to a serial configuration, thus multiplying the amplitude of the input supply voltage. The actual voltage obtained at the charge pump output terminal depends upon the number of pump stages, the clock frequency, and on the charge transfer efficiency of each pump stage.

Present fabrication methods for memory devices employ separate processing steps for the creation of a memory device dielectric layer and a charge pump capacitor dielectric layer. Additionally, the charge pump capacitor presently occupies a significant portion of the total memory device area. A continuing goal in semiconductive wafer fabrication processes is to minimize processing steps, and particularly to minimize transfers of semiconductive wafers between separate processing chambers. Accordingly, it would be desirable to develop fabrication processes wherein fabrication steps could be eliminated. Furthermore, it also would be desirable to reduce the size of the charge pump capacitor.

SUMMARY OF THE INVENTION

In the light of the foregoing, it is an object of this invention to provide a method for reducing the number of processing steps for the creation of a non-volatile memory device, and to reduce the size of a charge pump capacitor within the non-volatile memory device.

A first embodiment of the present invention provides a non-volatile memory device having a memory cell array which includes a plurality of non-volatile memory cells. Each cell is formed on a semiconductor substrate and includes a control gate layer and a dielectric layer interposed between the semiconductor substrate and the control gate layer. The non-volatile memory device further includes a charge pump for providing a stepped up voltage for programming, reading or erasing the plurality of non-volatile memory cells. The charge pump has at least one capacitor for producing the stepped up voltage, and the capacitor includes a dielectric layer interposed between two capacitor plates. The two capacitor plates are formed respectively by the semiconductor substrate and the control gate layer. The capacitor dielectric layer and the non-volatile memory cell dielectric layer are formed during the same processing step.

A second embodiment of the present invention provides a non-volatile memory device having a memory cell array which includes a plurality of non-volatile memory cells. Each cell is formed on a semiconductor substrate and includes a floating gate polysilicon layer and a control gate layer. A tunnel oxide layer is interposed between the floating gate polysilicon layer and the semiconductor substrate, and a dielectric layer is interposed between the floating gate polysilicon layer and the control gate layer. The non-volatile memory device further includes a charge pump for providing a stepped up voltage for programming, reading or erasing the plurality of non-volatile memory cells. The charge pump has at least one capacitor for producing the stepped up voltage, and the capacitor includes a dielectric layer interposed between two capacitor plates. The two capacitor plates are formed respectively by the semiconductor substrate and the control gate layer. The capacitor dielectric layer and the non-volatile memory cell dielectric layer are formed during the same processing step.

A third embodiment of the present invention includes a method for creating a non-volatile memory device. The method includes forming a diffusion well in a semiconductor substrate and depositing a dielectric layer over the semiconductor substrate. A first gate charge trapping dielectric and a charge pump capacitor dielectric are formed by patterning the dielectric layer to remove a portion of the dielectric layer from a periphery area of the semiconductor substrate. A gate oxide is formed in the periphery area and a control gate is deposited over the first gate charge trapping dielectric, gate oxide, and charge pump capacitor dielectric. Source and drain regions are formed by doping the respective regions of the semiconductor substrate.

A fourth embodiment of the present invention also includes a method for creating a non-volatile memory device. The method includes growing a tunnel oxide layer on the semiconductor substrate and depositing a first gate over the tunnel oxide layer. The tunnel oxide layer and the first gate are patterned to remove the first gate and the tunnel oxide layer from a periphery area of the semiconductor substrate. A diffusion well, source and drain regions are formed by doping the respective regions of the semiconductor substrate, and an interpoly dielectric layer is deposited over the first gate and the semiconductor substrate. The interpoly dielectric layer is etched to remove a portion of the interpoly dielectric layer from a periphery area, while leaving the interpoly dielectric over the first gate and the diffusion well. The interpoly dielectric layer over the diffusion well forms a charge pump capacitor dielectric. A gate oxide is deposited into the periphery area, and a control gate is deposited over the first gate, gate oxide, and charge pump capacitor dielectric.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF THE INVENTION

Figure 1:
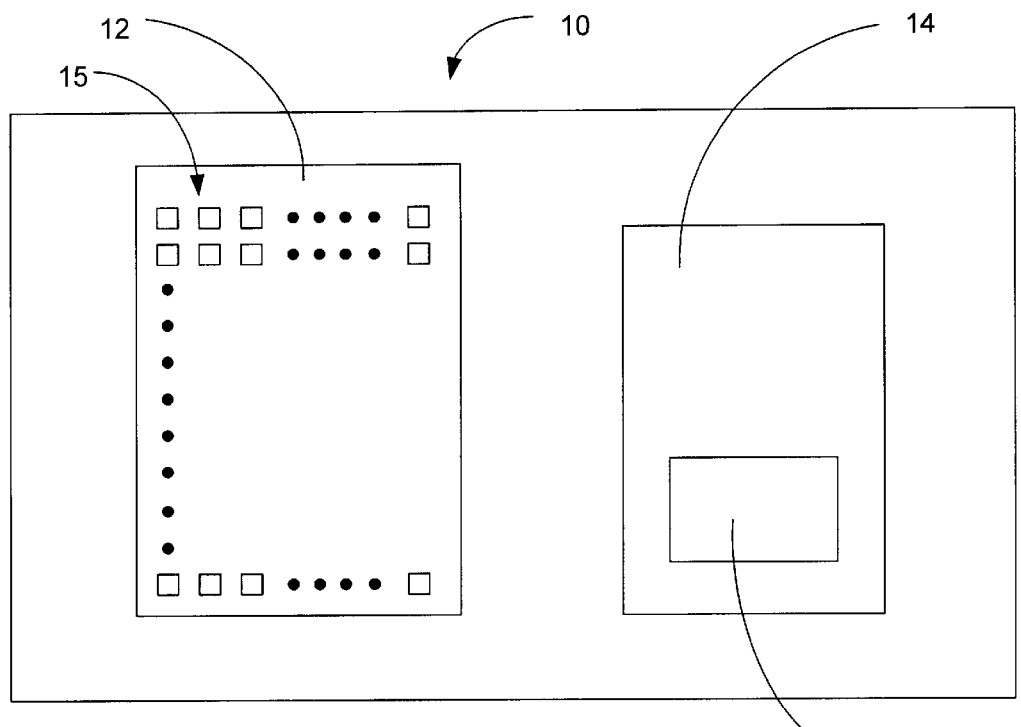
FIG. 1 is a simplified block diagram of a non-volatile memory device.

The following is a detailed description of the present invention in conjunction with the attached drawings, wherein like reference numerals will refer to like elements throughout.

Referring now to FIG. 1, the basic layout of a memory device 10 is shown. The memory device 10 typically includes a memory cell array 12 and associated periphery circuitry 14. Included within the memory cell array 12 are a plurality of non-volatile memory cells 15, and included within the periphery circuitry 14 is a charge pump 16. In general, a number of memory cells (not shown) are arranged in a row-column matrix to form the memory cell array 12. Typically, the memory cells disposed in a same column in the cell array 12 share a bit line, while the memory cells disposed in a same row share a word line. The periphery circuitry 14 interfaces with the memory cells and external components to coordinate the storage and retrieval of data. For example, when a write command is received by the periphery circuitry 14, it must access the proper memory cells, based on a designated address, to accept the incoming data from the data bus while at the same time effectively disabling the memory cells that are not to receive the data. As is conventional, the charge pump 16 steps up the incoming supply voltage to levels that are required by the memory cells for program and erase operations. Typically these voltage levels are approximately 10 to 12 volts, or about two to ten times the operating supply voltage coming into the memory device.

Figure 2A:
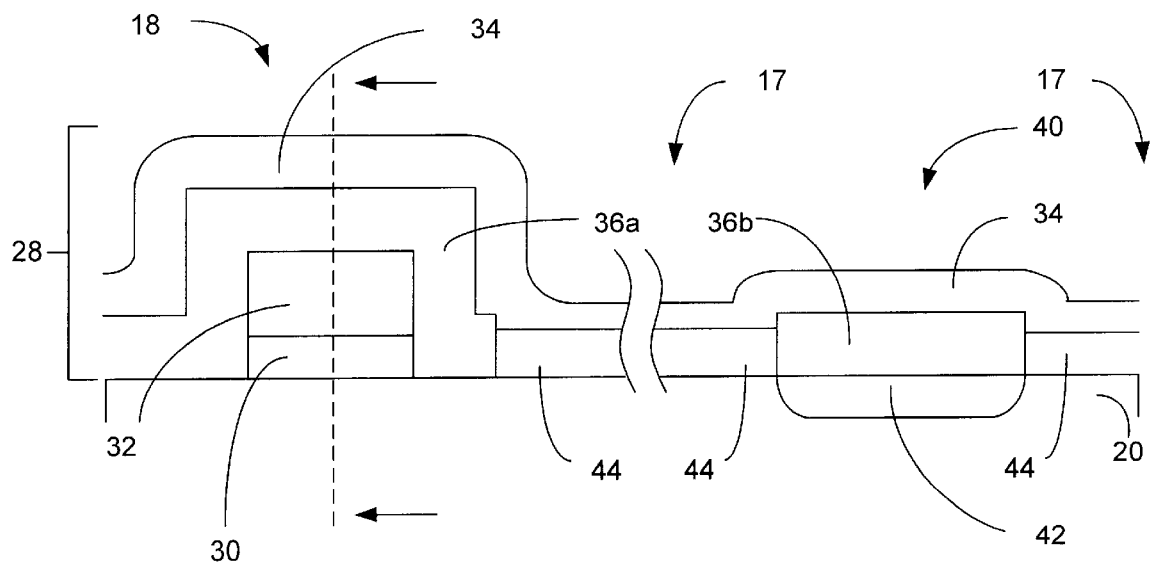
FIG. 2A illustrates a sectional view of one embodiment of the present invention.
Figure 2B:
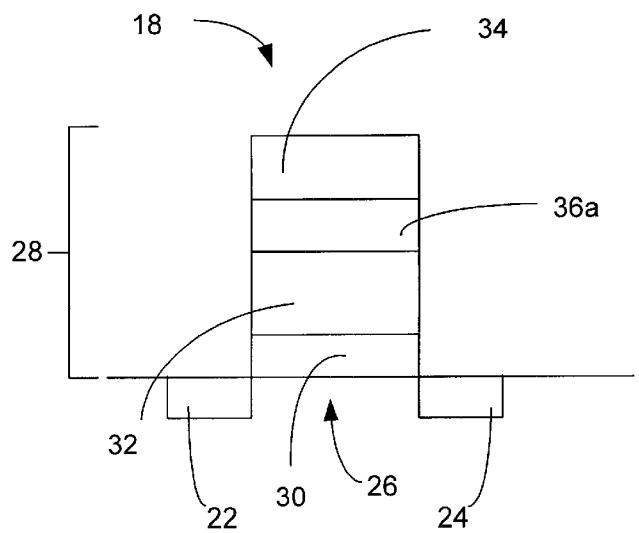
FIG. 2B illustrates a cross sectional view of the memory core of FIG. 2A.

Referring now to FIGS. 2A and 2B, a cross sectional view illustrating the inventive features of one embodiment is shown. In this embodiment, a given memory cell 18 included within the memory cell array 12 typically includes a source region 22, a drain region 24, and a channel region 26 in a substrate 20, and a stacked gate structure 28 overlying the channel region 26. The stacked gate structure 28 is isolated from the channel region 26 by a dielectric layer 30, which is usually a thin oxide layer and is commonly referred to as the tunnel oxide layer. The stacked gate structure 28 typically includes a first polysilicon layer 32, which is commonly referred to as the floating gate, and a second polysilicon layer 34, which is commonly referred to as the control gate. It is noted that a polysilicon control gate is merely exemplary, and other materials may be used to form the control gate. For example, metal gates such as tungsten and silicon-germanium may be used to form the control gate. The floating gate 32 and control gate 34 are isolated from each other by an interpoly dielectric layer 36a. It will be appreciated by those skilled in the art that the memory cell 18 may be configured as a PMOS device or as an NMOS device.

Also shown in FIG. 2A is a charge pump capacitor 40 included within the charge pump 16. The capacitor 40 includes the substrate 20 doped with a first dopant, e.g. a P type dopant. A diffusion well 42 is formed in the substrate 20 and is doped with a second dopant, e.g. an N type dopant. A dielectric layer 36b is formed over the diffusion well 42 and serves as the capacitor dielectric for the charge pump capacitor 40. As will be explained in more detail below, the charge pump capacitor dielectric layer 36b and the memory cell interpoly dielectric layer 36a are formed during the same processing step. A gate oxide layer 44 is deposited or grown in the periphery area 17 of the charge pump capacitor. A polysilicon layer 34 is deposited over the dielectric layer 36a and 36b, wherein the polysilicon layer 34 is the same polysilicon layer used in the memory cell 18. The diffusion well 42 and the polysilicon layer 34 form the respective plates of the charge pump capacitor 40, and the dielectric layer 36b serves as the capacitor dielectric between the plates.

As one skilled in the art will appreciate, an advantage of the present invention is that the memory cell interpoly dielectric layer 36a and the charge pump capacitor dielectric layer 36b are formed of the same layer and thus may be formed in the same processing step. In doing so, processing steps are minimized over the prior art as these two layers were previously created in separate processing steps.

Recently, the design and manufacture of semiconductor devices have begun to employ the use of high-K materials for the interpoly dielectric layer. A high-K material is a dielectric material that has a high dielectric constant, typically in the range of twenty (20) or above. High-K dielectric materials are well known by those skilled in the art and, for sake of brevity, will not be discussed in detail herein. An interpoly dielectric layer made from a high-K material may be desirable in memory devices to minimize performance degrading effects, such as leakage, that may occur when the thickness of a standard-K dielectric material is otherwise made thin (e.g., approaching about 10 Å) as a result of scaling. A high-K dielectric allows for the establishment of a suitable capacitance with a physically thicker dielectric layer. For example, a lanthanum oxide ($La_2O_3$) gate dielectric having a K of about 20 and a thickness of about 100 Å is substantially electrically equivalent to an aluminum oxide ($Al_2O_3$) gate dielectric having a K of about 10 and a thickness of about 50 Å. In addition, devices fabricated with a high-K dielectric layer tend to have improved reliability.

In addition to facilitating reducing the size of memory devices, high-K dielectric materials also may facilitate reducing the size of the charge pump capacitor. The capacitance of a parallel plate capacitor is well known by those skilled in the art. The capacitance may be calculated from the formula $C=k\epsilon_0 A/d$, where A is the plate area, d is the distance of separation between the plates, k is the dielectric constant of the material between the plates, and $\epsilon_0$ is the permittivity constant. Of particular interest in this formula is k, the dielectric constant of the material between the plates of the capacitor. As can be seen from the formula, as k is increased the capacitance also increases (assuming all other parameters remain unchanged). Thus, if a material with a high dielectric constant (high-K) is used as the dielectric layer 36b of the charge pump capacitor 40, the capacitor area may be decreased while retaining the same value of capacitance.

Figure 3A:
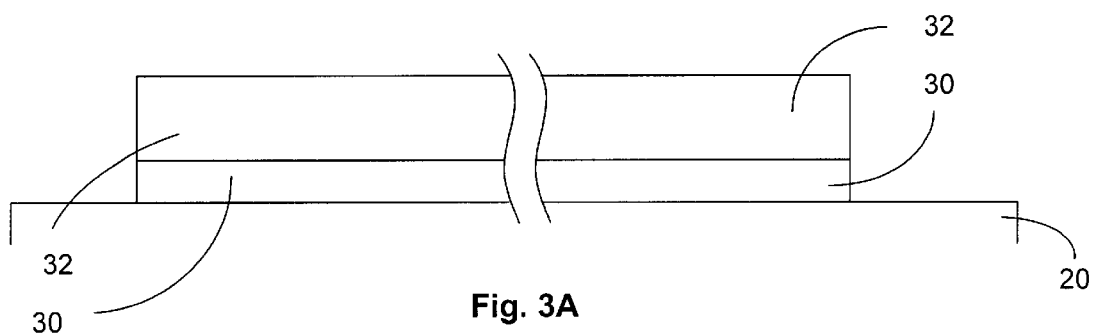
FIG. 3A is illustrates a sectional view of the creation of the tunnel oxide layer and the first gate layer of the device shown in FIG. 2A.
Figure 3B:
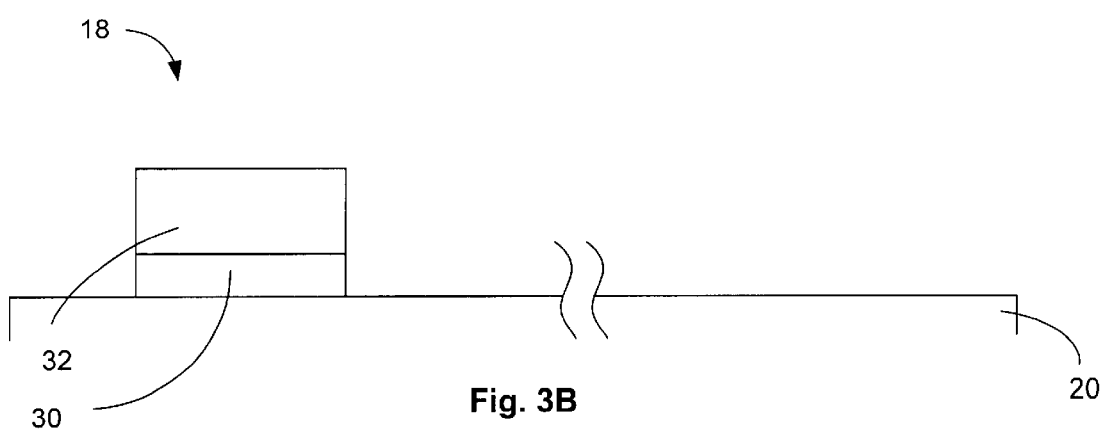
FIG. 3B illustrates a sectional view of the creation of the floating gate by masking and etching the device of FIG. 3A.

Referring to FIGS. 3A–3G, the process for constructing the embodiment of FIG. 2A will be described in detail. Beginning with FIG. 3A, an oxide layer (tunnel oxide) 30 is deposited or grown on a semiconductor substrate 20. Deposition or growth may be performed through various well known processes, such as chemical vapor deposition (CVD). Following the formation of the tunnel oxide layer 30, a floating gate layer 32 is deposited on the tunnel oxide layer 30 as shown in FIG. 3A. Employing photolithography or other conventional techniques, the structure of FIG. 3A is masked and etched to remove the deposited material from the desired areas of the structure, while retaining an area that will eventually form the gate stack of the memory cell 18. The result of this process is shown in FIG. 3B.

Figure 3C:
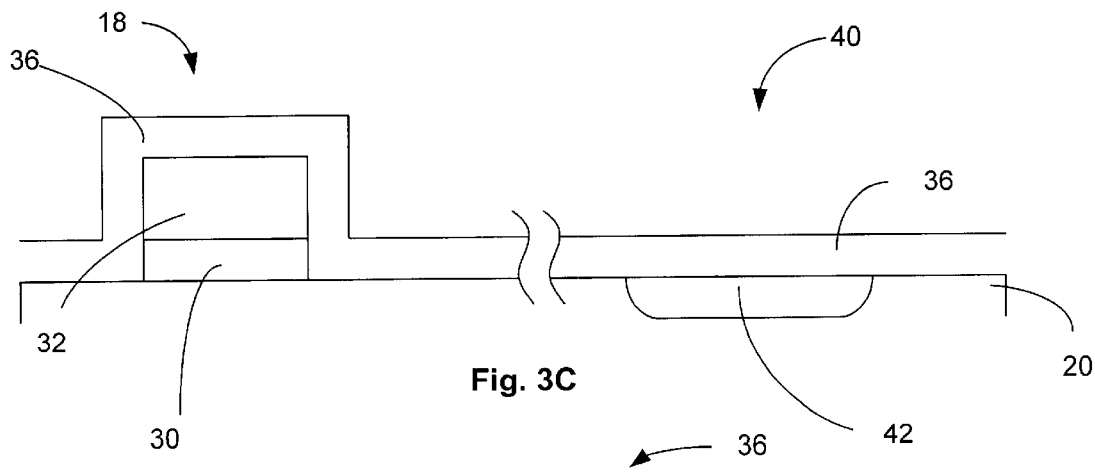
FIG. 3C illustrates a sectional view of the formation of the interpoly dielectric layer, which is common to both the memory cell and the charge pump capacitor in the present invention.
Figure 3D:
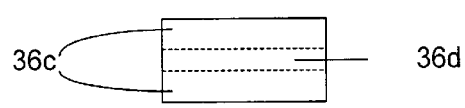
FIG. 3D illustrates a sectional view showing the Oxide-Nitride-Oxide (ONO) layer of the gate dielectric.
Figure 3E:
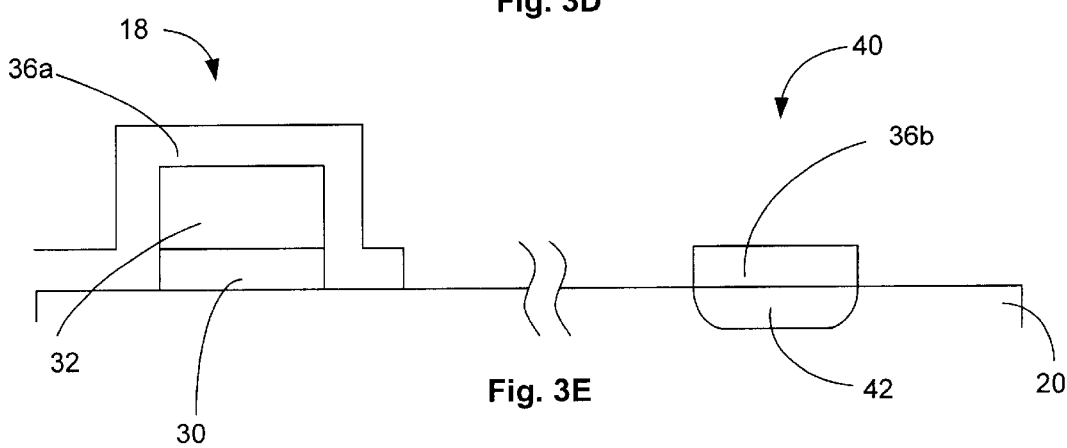
FIG. 3E illustrates a sectional view of the formation of the memory cell and the charge pump capacitor by masking and etching the device of FIG. 3C.

Referring now to FIG. 3C, the diffusion well 42 is formed by doping the respective region of the substrate 20. Thereafter, the interpoly dielectric layer 36 is deposited over the structure as shown in FIG. 3C. The interpoly dielectric layer 36 is then patterned and etched in order to define the interpoly dielectric layer 36a for the memory cell 18 and the capacitor dielectric layer 36b for the charge pump capacitor 40. The interpoly dielectric layer 36 is typically an oxide-nitride-oxide (ONO) composition and is shown in detail in FIG. 3D. As can be seen in FIG. 3D, the nitride layer 36d has an oxide layer 36c both above and below the nitride layer 36d. The patterned and etched device is shown in FIG. 3E. Thus, in a single step the dielectric layer 36a and 36b for the memory cell 18 and the charge pump capacitor 40, respectively may be created.

Figure 3F:
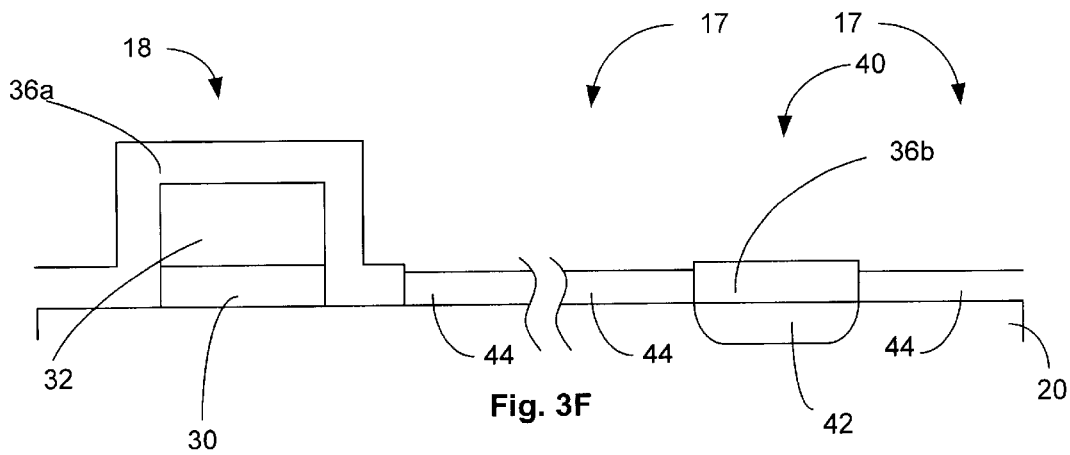
FIG. 3F illustrates a sectional view of the formation of the gate oxide in the periphery area of the charge pump.
Figure 3G:
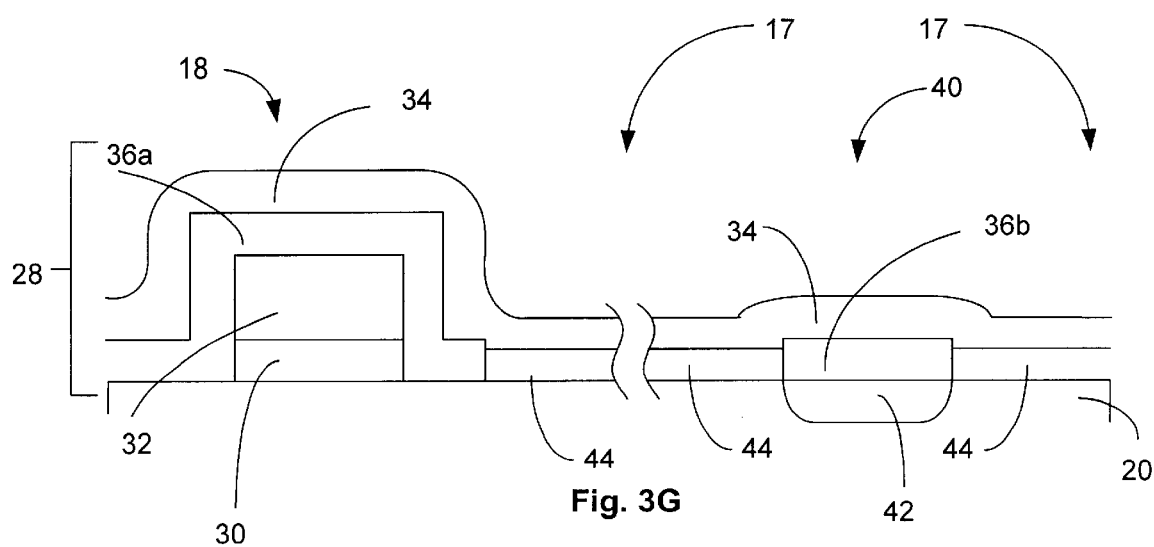
FIG. 3G illustrates a sectional view of the creation of the control gate to form the complete device of the first embodiment.

Referring now to FIG. 3F, a gate oxide layer 44 is deposited or grown in the periphery area 17 of the device. Next, FIG. 3G shows the deposition of the polysilicon control gate 34 over the memory cell 18 and charge pump capacitor 40. The stacked gate structure 28 is then etched to define adjacent memory cells 18 (in a direction perpendicular to the plane of the paper). The source 22 (FIG. 2B) and drain 24 (FIG. 2B) regions are formed by doping the respective regions of the substrate, thus completing the process in relevant part.

Figure 4A:
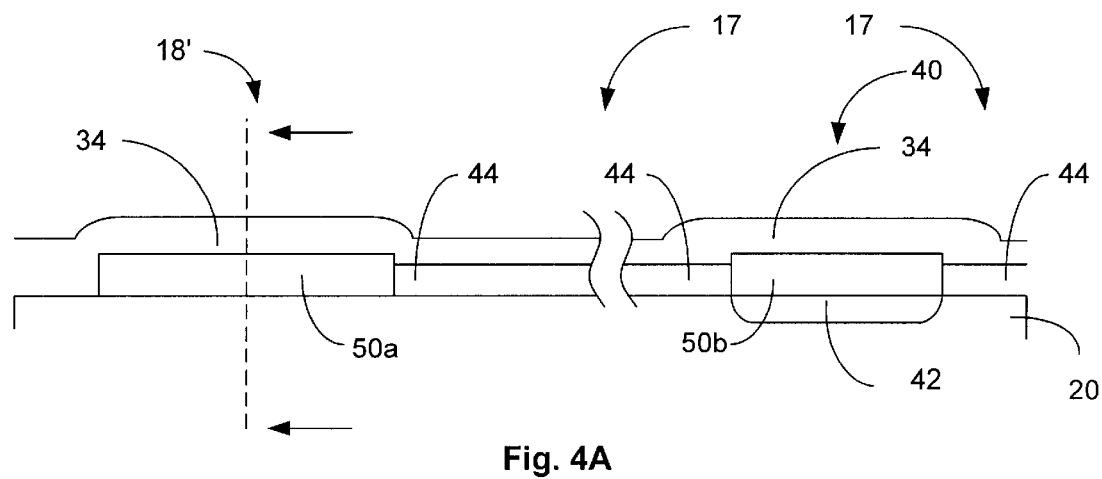
FIG. 4A illustrates a sectional view of a second embodiment of the present invention.
Figure 4B:
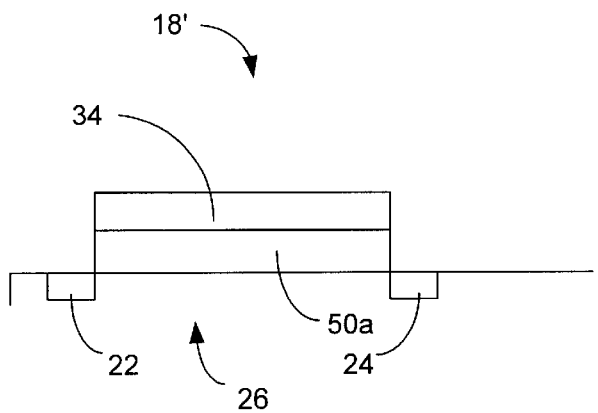
FIG. 4B illustrates a cross sectional view of the memory core of FIG. 4A.

Referring now to FIGS. 4A and 4B, a cross sectional view illustrating the inventive features of a second embodiment is shown. The device shown in FIG. 4A is a SONOS (silicon-oxide-nitride-oxide-silicon) type device. SONOS devices are well known in the art and therefore will not be described in detail herein. In this embodiment, a given memory cell 18' included within the memory cell array 12 typically includes a source region 22, a drain region 24, and a channel region 26 in a substrate 20. A gate charge trapping dielectric 50a defines the channel region 26. The gate charge trapping dielectric 50a may be an oxide-nitride-oxide (ONO) layer. However, as will be appreciated by those skilled in the art, the gate charge trapping dielectric layer 50a may be formed using other standard-K dielectric materials or high-K dielectric materials. A poly silicon layer 34 forms the control gate for the memory cell 18'. As was noted previously, the use of polysilicon for the control gate is merely exemplary and other materials may be used to form the control gate. It will be appreciated by those skilled in the art that the memory cell 18' may be configured as a PROS device or as an NMOS device.

Also, shown in FIG. 4A is a charge pump capacitor 40. As described previously, the capacitor 40 includes the substrate 20 doped with a first dopant, e.g. a P type dopant. A diffusion well 42 is formed in the substrate 20 and is doped with a second dopant, e.g. an N type dopant. A dielectric layer 50b is formed over the diffusion well 42 and serves as the capacitor dielectric for the charge pump capacitor. As will be explained below, the charge pump capacitor dielectric layer 50b and the memory cell dielectric layer 50a are formed during the same processing step. A gate oxide layer 44 is deposited or grown in the periphery area 17 of the charge pump capacitor. A polysilicon layer 34 is deposited over the dielectric layer 50b. The diffusion well 42 and the polysilicon layer 34 form the respective plates of the charge pump capacitor 40, and the dielectric layer 50b serves as the capacitor dielectric between the plates.

Figure 5A:
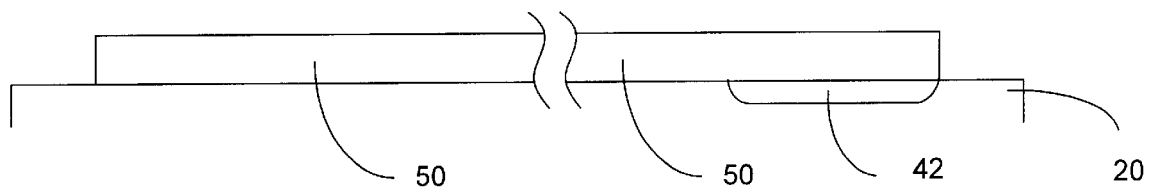
FIG. 5A illustrates a sectional view of the creation of the ONO layer of a second embodiment of the present invention.
Figure 5B:
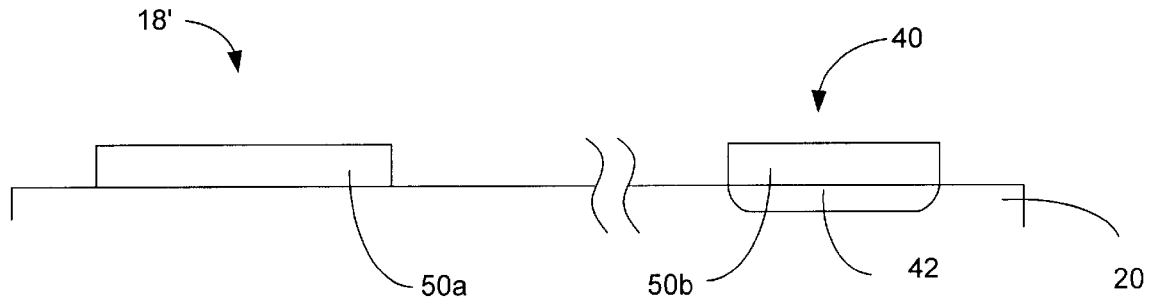
FIG. 5B illustrates a sectional view of the initial formation of the memory cell and the charge pump capacitor after masking and etching the device of FIG. 5A.

Referring to FIGS. 5A–5D, the process for constructing the embodiment of FIG. 4A will be described in detail. Beginning with FIG. 5A, a diffusion well 42 is formed in the substrate 20 by doping the substrate, and an oxide-nitride-oxide (ONO) layer 50 is deposited or grown on a semiconductor substrate 20. Deposition or growth may be performed through various well known processes, such as chemical vapor deposition (CVD). Employing photolithography or other conventional techniques, the structure of FIG. 5A is masked and etched to remove the deposited material from the desired areas of the structure, while retaining an area that will eventually form the memory cell 18' and the charge pump capacitor 40. The result of this process is shown in FIG. 5B. As was the case with the device of FIGS. 3A–3G, the ONO layer 50 forms the dielectric layer for the memory cell 18' and the charge pump capacitor 40, thus creating both layers in a single step.

Figure 5C:
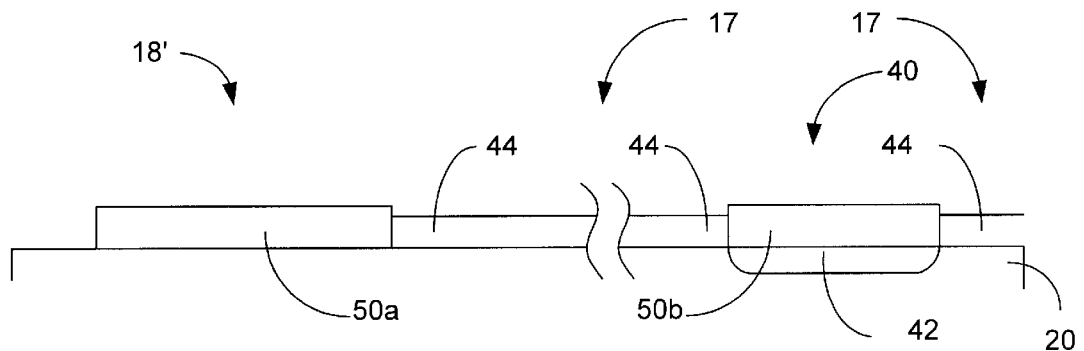
FIG. 5C illustrates a sectional view of the creation of the gate oxide in the periphery area of the invention.
Figure 5D:
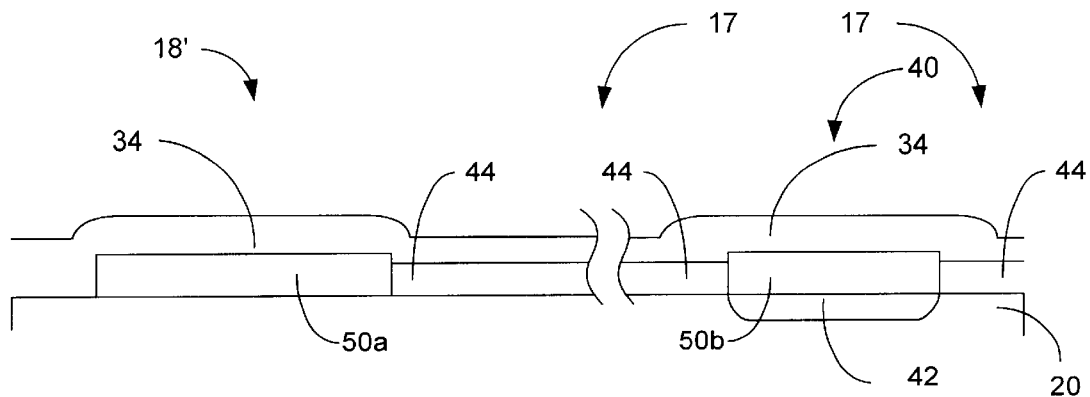
FIG. 5D illustrates a sectional view of the creation of the control gate to form the complete device of the second embodiment.

Referring now to FIG. 5C, a gate oxide layer 44 is deposited or grown in the periphery area 17 of the device, and in FIG. 5D a polysilicon control gate 34 is deposited over both the memory cell 18' and the charge pump capacitor 40. Finally, the polysilicon control gate 34 and gate charge trapping dielectric 50a are etched and the source 22 (FIG. 4B) and drain 24 (FIG. 4B) are formed by doping the respective regions of the substrate, as shown in FIG. 5D.

Thus, in each embodiment the dielectric layer for the memory cell and the charge pump capacitor may be created in a single processing step. Furthermore, the use of high-K dielectric materials may facilitate a reduction in the size of the charge pump capacitor while retaining the same capacitance.

Although the invention is described in detail with respect to only one memory cell and one charge pump capacitor, it will be appreciated that many memory cells can be formed simultaneously and the charge pump can have more than one capacitor formed simultaneously in the same manner described.

Furthermore, while particular embodiments of the invention have been described in detail, it is understood that the invention is not limited correspondingly in scope, but includes all changes, modifications and equivalents coming within the spirit and terms of the claims appended hereto.

What is claimed is:

1. A non-volatile memory device, comprising:

a silicon-oxide-nitride-oxide semiconductor (SONOS) memory cell array including a plurality of non-volatile memory cells each formed on a semiconductor substrate, each of the memory cells comprising a control gate layer and a dielectric layer interposed between the semiconductor substrate and the control gate layer; and a charge pump for providing a stepped up voltage for programming, reading or erasing the plurality of non-volatile memory cells, the charge pump including at least one capacitor for producing the stepped up voltage, and the at least one capacitor including a dielectric layer interposed between two capacitor plates;

wherein the dielectric layer interposed between the two capacitor plates comprises the dielectric layer of the memory cells in the memory cell array, and the two capacitor plates are formed respectively by the semiconductor substrate and the control gate layer.

2. The non-volatile memory device of claim 1, wherein the dielectric layer is comprised of a high-K dielectric material.

3. The non-volatile memory device of claim 1, wherein the dielectric layer is comprised of a standard-K dielectric material.

4. The non-volatile memory device of claim 1, wherein the dielectric layer is comprised of an oxide-nitride-oxide material.

5. The non-volatile memory device of claim 1, wherein the non-volatile memory cells are configured as an NMOS device.

6. The non-volatile memory device of claim 1, wherein the non-volatile memory cells are configured as an PMOS device.

* * * * *